US008275152B2

(12) United States Patent
Smirnov et al.

(10) Patent No.: US 8,275,152 B2
(45) Date of Patent: Sep. 25, 2012

(54) DYNAMIC BASS BOOST FILTER

(75) Inventors: Serge Smirnov, Redmond, WA (US);
John Bregar, Seattle, WA (US); James D. Johnston, Redmond, WA (US); Chris Messer, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1404 days.

(21) Appl. No.: 11/859,655

(22) Filed: Sep. 21, 2007

(65) Prior Publication Data
US 2009/0080675 A1 Mar. 26, 2009

(51) Int. Cl.
*H03G 5/00* (2006.01)
(52) U.S. Cl. .......... 381/98; 381/104; 381/109; 381/102; 381/61
(58) Field of Classification Search .......... 381/61, 381/98–99, 104–105, 107, 109, 103, 56, 381/102
See application file for complete search history.

(56) References Cited

U.S. PATENT DOCUMENTS

| 4,739,514 | A |   | 4/1988  | Short et al. |        |
|-----------|---|---|---------|--------------|--------|
| 4,764,967 | A |   | 8/1988  | Christopher  |        |
| 5,046,105 | A |   | 9/1991  | Bohn         |        |
| 5,255,324 | A |   | 10/1993 | Brewer et al.|        |
| 5,359,665 | A | * | 10/1994 | Werrbach     | 381/102|
| 5,361,381 | A |   | 11/1994 | Short        |        |
| 5,434,922 | A |   | 7/1995  | Miller et al.|        |
| 5,481,617 | A |   | 1/1996  | Bjerre       |        |
| 6,845,165 | B1| * | 1/2005  | Motohashi et al. | 381/98 |
| 7,016,509 | B1|   | 3/2006  | Bharitkar et al. |    |
| 7,171,010 | B2|   | 1/2007  | Martin et al.|        |
| 7,184,556 | B1|   | 2/2007  | Johnson et al. |      |
| 2003/0145025 | A1 |  | 7/2003 | Allred et al. |      |
| 2004/0022400 | A1 |  | 2/2004 | Magrath       |       |
| 2004/0032959 | A1 |  | 2/2004 | Montag et al. |       |
| 2005/0094828 | A1 |  | 5/2005 | Sugimoto      |       |
| 2005/0185802 | A1 |  | 8/2005 | Yoshida       |       |
| 2005/0213780 | A1 | * | 9/2005 | Berardi et al. | 381/103 |
| 2006/0274903 | A1 | * | 12/2006 | Aoki et al.  | 381/56 |
| 2008/0175409 | A1 | * | 7/2008 | Lee et al.    | 381/98 |

OTHER PUBLICATIONS

U.S. Appl. No. 11/770,616, filed Jun. 28, 2007, Smirnov et al.
Aarts et al., "Improving perceived bass and reconstruction of high frequencies for band limited signals," *Proc. 1st IEEE Benelux Workshop on Model based Processing and Coding of Audio (MPCA—2002)*, Leuven, Belgium, pp. 59-71, Nov. 15, 2002.
Microsoft, "Reusing Windows Vista Audio System Effects," <http://download.microsoft.com/download/9/c/5/9c5b2167-8017-4bae-9fde-d599bac8184a/Vista_SysFX.doc>, 38 pages, Sep. 15, 2006.

(Continued)

*Primary Examiner* — Goins Davetta
*Assistant Examiner* — Disler Paul
(74) *Attorney, Agent, or Firm* — Klarquist Sparkman, LLP

(57) ABSTRACT

Bass frequencies of audio can be dynamically boosted using various techniques and tools. The described techniques and tools can be applied separately or in combination. Bass frequencies of audio can be boosted using a linear combination of an input audio signal and output of a high-pass filter. For example, bass frequencies of audio can be boosted by applying a high-pass filter to an input audio signal to produce an output of the high-pass filter, determining a current level, determining a target gain amount, dynamically adjusting the input audio signal and the output of the high-pass filter, and combining the gain-adjusted signals to produce an output signal. A dynamic bass boost filter can comprise a high-pass filter and a dynamic boost module.

20 Claims, 15 Drawing Sheets

OTHER PUBLICATIONS

Ben-Tzur et al., "The Effect of the MaxxBass Psychoacoustic Bass Enhancement System on Loudspeaker Design," <http://www.maxx.com/objects/MaxxBassAESPaper.pdf>, 10 pages, Apr. 1999.

Barkakati et al., "High-Fidelity Computer Loudspeakers," <http://teams.gemstone.umd.edu/classof2006/hifi/documents/research%20proposal%2003%2025%202004%20rev%202.doc>, 11 pages, Mar. 25, 2004.

Gardner, "3-D Audio Using Loudspeakers," <http://sound.media.mit.edu/Papers/gardner_thesis.pdf>, 153 pages, Sep. 1997.

Head-Fi, "Bass Boost Shelving Filter Equations" <http://www.head-fi.org/forums/showthread.php?t=104392>, 9 pages (accessed May 2, 2007).

Oppenheim and Schafer, "Discrete-Time Signal Processing," pp. 382-384 ($2^{nd}$ ed. Prentice-Hall 1999).

* cited by examiner

DYNAMIC BASS BOOST FILTER

BACKGROUND

In part, the quality of audio that is played back to a listener depends on how the audio was recorded and how the audio was compressed/decompressed (if at all). A playback device can sometimes perform processing during playback, however, to improve the listening experience.

Bass boost is often desirable for music playback for a number of reasons. For example, bass boost can compensate for limitations of the playback system (e.g., small speakers can sound hollow without adequate bass). Bass boost can make bass audible when a recording mixed for listening in quiet environments is played in noisy environments. Bass boost can satisfy listener taste for boost level, which may differ substantially from the mixing engineer's. Finally, bass boost can compensate for bass level in modern recordings, which in some situations is limited in order to maximize loudness (e.g., since the human ear is less sensitive to bass than midrange/treble, bass does not contribute significantly to loudness and thus optimizing loudness means devoting most of the available signal range to midrange/treble).

In some situations, a fixed (static) bass boost (e.g., a linear filter) sounds good but leads to some problems. For example, in a fixed bass boost filter the desired amount of boost depends on the bass level in the original content, so the user must often adjust the bass control from one piece of content to the next. Furthermore, excessive boost of content that has a lot of bass to begin with tends to produce distortion in analog components of the playback chain (e.g., speakers, headphones, amplifiers). Finally, boosting bass frequencies of a digital representation of a signal runs into digital fullscale saturation problems with most modern content (because the content fully utilizes the available digital range to begin with), which necessitates compromises such as reduction on the overall volume in response to excessive bass levels.

Compression of bass frequencies can also be a desirable effect either separately or in combination with bass boost. Compression of the bass band is an audio effect commonly used in broadcast radio and other situations. The direct approach to bass band compression involves splitting the signal into sub-bands and applying compression separately to the low-frequency sub-band. However, finite precision filter implementation challenges can make it difficult to achieve the desired frequency response for the lower sub-band directly.

Therefore, there exists ample opportunity for improvement in technologies related to boosting bass frequencies of audio.

SUMMARY

In summary, the detailed description is directed to various techniques and tools for boosting bass frequencies of audio (e.g., during audio playback using an audio playback device).

According to one aspect of the techniques and tools described herein, bass frequencies of audio are dynamically boosted. An input audio signal is received and a high-pass filter is applied to the input audio signal to produce an output of the high-pass filter. A current level is determined by subtracting the output of the high-pass filter from the input audio signal. A target gain amount is determined based at least in part upon a target level and the current level. Based at least in part on the target gain amount, the output of the high pass filter is adjusted by a first gain and the input audio signal by a second gain. An output audio signal is produced by combining the gain-adjusted input audio signal and the gain-adjusted output of the high-pass filter.

In another aspect, the current level is an aggregate level generated from a plurality of input samples.

According to another aspect of the techniques and tools described herein, a dynamic integer bass boost filter comprises a high-pass filter configured to receive an input audio signal and produce an output of the high pass filter. The dynamic integer bass boost filter also comprises a dynamic boost module configured to determine a current level by subtracting the output of the high-pass filter from the input audio signal. The dynamic boost module is also configured to determine a target gain amount based at least in part upon a target level and the current level. The dynamic boost module is also configured to, based at least in part on the target gain amount, dynamically adjust the output of the high-pass filter by a first gain and dynamically adjust the input audio signal by a second gain. The dynamic integer bass boost filter produces an output audio signal by combining the gain-adjusted input audio signal and the gain-adjusted output of the high-pass filter.

The described techniques and tools for bass boost can be implemented separately or in combination. For example, the techniques and tools can be implemented as stages of a digital signal processing (DSP) pipeline.

DETAILED DESCRIPTION

The following description is directed to techniques, tools, and solutions for boosting bass frequencies of audio (e.g., dynamically boosting bass frequencies of audio) using a bass boost filter (e.g., an integer bass boost filter).

The various techniques, tools, and solutions can be used in combination or independently. Different embodiments can implement one or more of the described techniques, tools, and solutions.

I. Audio Processing Device

The technologies, techniques, and solutions described herein can be implemented on any of a variety of devices in which audio signal processing is performed (e.g., audio processing devices), including among other examples, computers, portable audio players, MP3 players, digital audio/video players, PDAs, mobile phones, smart phones, DVD and CD players, audio conferencing devices, computer components such as audio or sound cards, network audio streaming devices, etc. The technologies, techniques, and solutions described herein can be implemented in hardware circuitry (e.g., in circuitry of an ASIC, FPGA, etc.), as well as in audio processing software executing within a computing device or other computing environment (e.g., executed on a central processing unit (CPU), a digital signal processor (DSP), or a combination).

Figure 1:
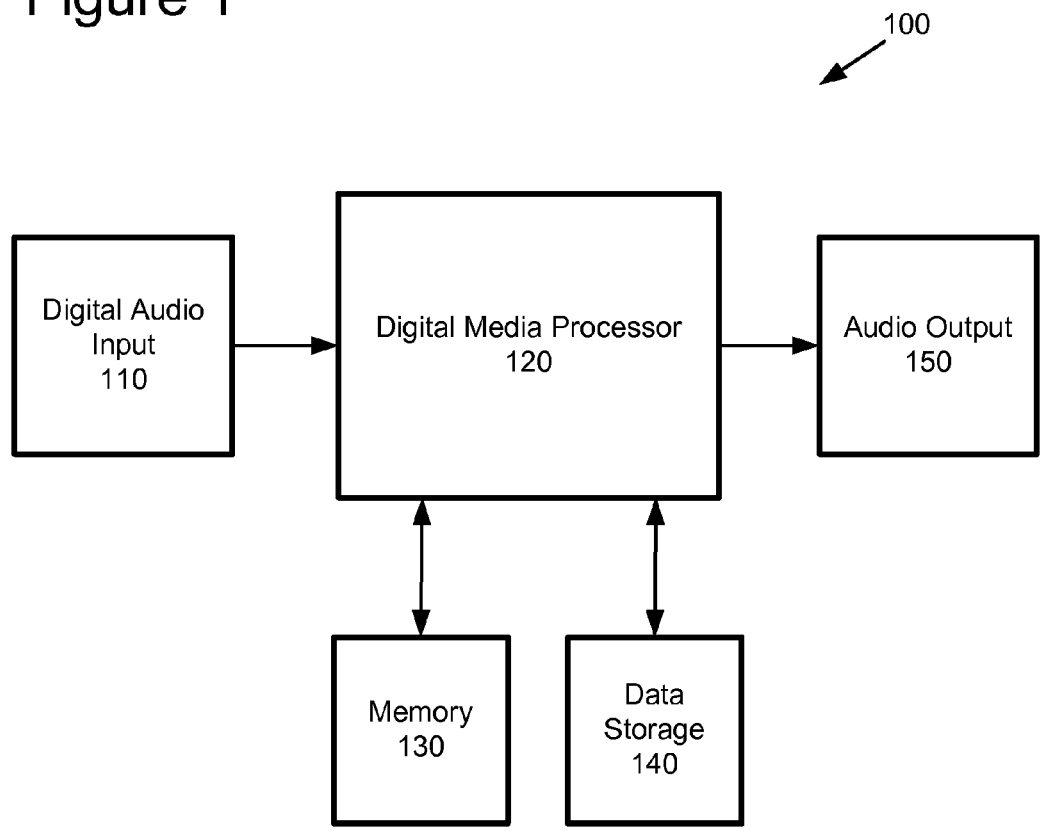
FIG. 1 is a block diagram of a suitable audio processing device in which some described techniques and tools may be implemented.

FIG. 1 depicts a generalized block diagram of a suitable audio processing device 100 in which described embodiments may be implemented. The audio processing device 100 is not intended to suggest any limitation as to scope of use or functionality of the invention, as the present invention may be implemented in diverse general-purpose or special-purpose computing environments.

With reference to FIG. 1, the audio processing device 100 includes a digital audio input 110. The digital audio input 110 can accept one or more channels of digital audio data (e.g., stereo or multi-channel). The digital audio data can be encoded (e.g., MP3, WMA Pro, AAC, etc.). The digital audio input 110 can accept digital audio data from a variety of sources (e.g., a computer, an audio device such as a CD player, a network source such as a wireless media server or streaming audio from the Internet, etc.).

The audio processing device 100 includes a digital media processor 120. The digital media processor comprises one or more processors, such as DSPs and/or CPUs. In a specific implementation, the digital media processor 110 is a DSP. The digital media processor 120 communicates with memory 130. The memory 130 can comprise working memory and/or program memory. The memory 130 can contain program code for operating the digital media processor 120 to implement the technologies described herein. The digital media processor 120 communicates with data storage 140. For example, the data storage 140 can include flash memory and/or hard drive storage for storing digital audio data.

The audio processing device 100 includes an audio output 150. For example, the audio output 150 can be a digital audio output (e.g., for driving a digital audio amplifier) or an analog audio output (e.g., comprising D/A converters and producing an analog audio line out).

For example, the digital media processor 120 can receive a digital audio input signal 110. If necessary, the digital media processor 120 can decode the input signal. The digital media processor 120 can boost bass frequencies of the audio input signal using a dynamic bass boost filter as described herein. For example, the digital media processor 120 can execute instructions from the memory 130 in order to implement various audio processing technologies, such as the bass boost filter. The processed audio signal can then be output 150.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "check," "determine," and "find" to describe computer operations in a computing environment. These terms are high-level abstractions for operations performed by a computer, and should not be confused with acts performed by a human being. The actual computer operations corresponding to these terms vary depending on implementation.

II. Example Audio Playback System

Figure 2:
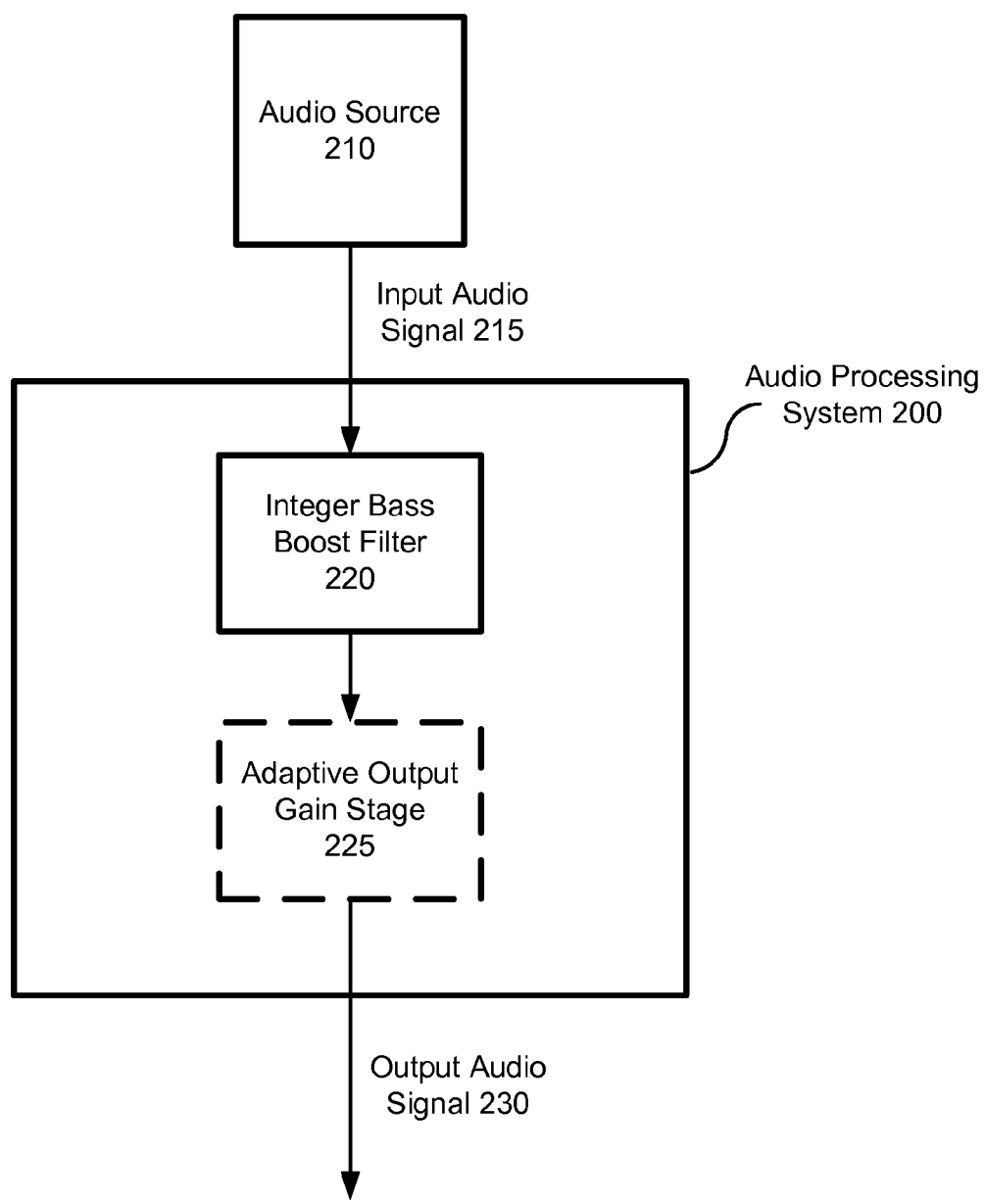
FIG. 2 is a block diagram of an audio playback system that can implement one or more of the bass boost solutions described herein.

The bass boost technologies described herein can be implemented on any of a variety of devices (e.g., audio processing devices). For example, the system, depicted in FIG. 2, shows at a high level a device that can be used to implement the bass boost technologies described herein.

In the example audio playback system for bass boost, an audio signal 215 is obtained from an audio source 210, which may be a CD player, digital media device (e.g., a digital audio player), decoder for a digital audio stream (e.g., in a Windows Media Audio (WMA), WMA Pro, or other digital audio format), or other audio signal source. The audio signal can comprise one or more audio channels (e.g., stereo or multi-channel audio such as 5.1 or 7.1). The audio content can be coded and decoded using a variant of WMA Pro, AC3, AAC or other coding/decoding technologies. The audio source 210 can be an external source (as shown in FIG. 2), or internally integrated in the audio processing system 200.

An integer bass boost filter 220 processes the audio signal 215 (an input audio signal) to produce an output audio signal 230. In general, an integer bass boost filter is any integer implementation of a filter that boosts bass frequencies of an audio signal.

The output audio signal 230 can then be used to drive (e.g., using an audio amplifier) an audio output device, such as speakers or headphones. An optional adaptive output gain stage 225 can be incorporated in the audio processing system 200 (e.g., to prevent clipping). The integer bass boost filter 220 can apply various bass boost techniques described herein (e.g., static or dynamic bass boost techniques) to boost bass frequencies of the input audio signal 215. In various applications, the audio processing system 200 can be implemented using a digital signal processor (DSP) or more generally a central processing unit (CPU) programmed to perform the signal processing techniques described herein.

The relationships shown between modules within the system indicate the main flow of information in the system; other relationships are not shown for the sake of simplicity. Depending on implementation and the type of processing desired in the system of FIG. 2 (or the other systems shown in the various topology and path diagrams presented in other Figures of the application), modules can be added, omitted, split into multiple modules, combined with other modules, and/or replaced with like modules.

III. Innovations in Bass Boost During Audio Playback

This section describes bass boost techniques and solutions that can be applied to playback of audio in various types of devices. For example, the techniques and solutions can be used to implement bass boost (e.g., integer bass boost) via a bass boost (e.g., integer bass boost) filter. The techniques and solutions can be directed to fixed or static bass boost implementations (e.g., where the boost amount is linear unless values are manually changed) or to dynamic bass boost implementations (e.g., where the amount of boost varies dynamically based on input levels).

Example solutions for providing bass boost (e.g., for audio playback devices) can include selecting integer filter coefficients directly in the integer domain. In many implementations, for reasonable noise performance processing 16-bit data using 32-bit integer arithmetic, the coefficient resolution can be limited, for practical purposes, to 9 bits (possibly 10 bits with special care). At that coefficient resolution, a coupled form denominator structure allows very limited choices for pole locations in that implementation. Thus, the available coefficient choices can be exposed directly to the user as a reasonable number of boost settings.

Example solutions for providing bass boost can use standard coupled form structure or modified coupled form structure. In some implementations, using modified coupled form structure can effectively simulate non-integer values of one of the integer coefficients (something not possible with corresponding standard coupled form denominator without additional scale up/down of coefficients and intermediate results which adds computational overhead and reduces integer arithmetic accuracy).

Example solutions for providing bass boost can yield a 2nd order filter denominator, and a [1,-2,1] numerator provides a basic bass boost curve. However, additional boost at lower frequencies may be desirable in some situations. In some implementations, arbitrary, or near-arbitrary, amounts of boost can be obtained at lower frequencies by observing that a linear combination of the numerator and the denominator yields a filter that is also a bass boost filter (in the sense that it has an essentially flat frequency response in the audio range above bass).

Example solutions for providing bass boost (e.g., a bass boost filter) can be followed by an adaptive output gain control stage to prevent clipping.

Thus, example solutions for providing bass boost can include one or more of the following features and techniques: user-settable bass boost parameters, direct translation of integer user-settable bass boost parameters into filter coefficients, a modified coupled form structure used to obtain intermediate "boost amount" settings, creation of different bass boost shapes by using a linear combination of the numerator and the denominator, and/or use of an adaptive gain device after the bass boost filter.

Bass boost solutions can be implemented via software, hardware, or a combination thereof.

For information regarding aspects of bass correction in some implementations, see U.S. Pat. No. 7,184,556, entitled "Compensation System and Method for Sound Reproduction," issued Feb. 27, 2007.

A. Bass Boost Using Standard Coupled Form

Figure 3:
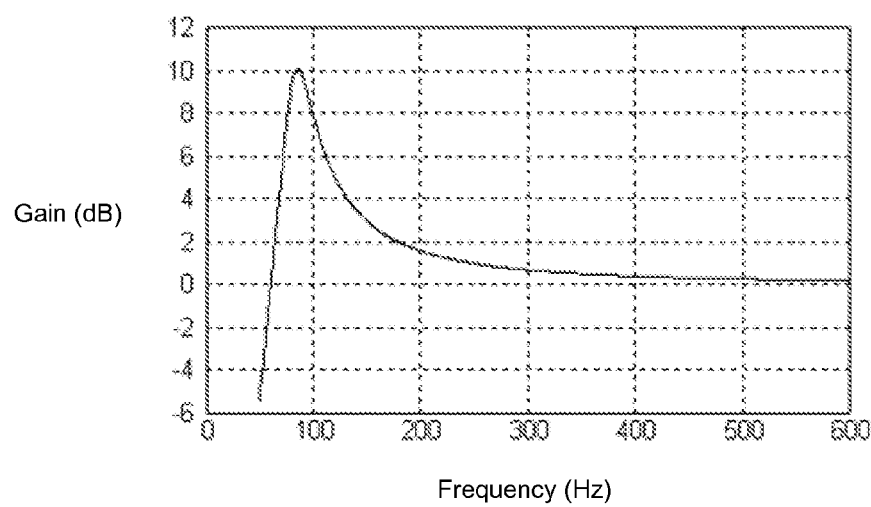
FIG. 3 depicts an example of a bass boost curve.

FIG. 3 shows an example prior art bass boost curve 300 representative of performance of a bass boost filter in typical implementations. A bass boost filter, such as a bass boost filter configured to produce the bass boost curve shape 300 depicted in FIG. 3, can strongly boost a range of frequencies where the output of a speaker of a playback device starts to weaken. The bass boost filter can also filter out frequencies below that range, where the output of the playback device speaker is often low in both amplitude and frequency, and not of particular interest.

In some implementations, the bass boost curve shape 300 is implemented by generally following the difference equation:

$$y[k]-2*r*\cos(a)*y[k-1]+r*r*y[k-2]=x[k]-2*x[k-1]+x[k-2]$$

where y[ ] is the output sequence, x[ ] is the input sequence, and r and a are the radius and angle, respectively, of a complex conjugate pole pair.

The Z transform of:

$$a0*y[k]+a1*y[k-1]+a2*y[k-2]=b0*x[k]+b1*x[k-1]+b2*x[k-2]$$

is:

$$Y(z)*(a0+a1*(1/z)+a2*/z/z)=X(z)*(b0+b1*1/z+b2*1/z/z)$$

It is common to describe the y[k] vs. x[k] difference equation by its transfer function, which is:

$$Y(z)/X(z)=(b0+b1*1/z+b2*1/z/z)/(a0+a1*(1/z)+a2*/z/z)$$

As such, the y[k] side of the difference equation (a0, a1, a2) is sometimes referred to as the denominator; it is the denominator in the Z-domain representation.

Filtering an input sequence x[ ] to produce output y[ ] at y[k], the following C code can be used to implement the denominator of the above difference equation using an example implementation of a standard coupled form structure with 9 bits of coefficient precision:

$$P0=m*(x[k]+x[k-2]-2*x[k-1])-((s*z1)>>9)+((c*p1)>>9)$$

$$z1=((s*p1)>>9)+((c*z1)>>9)$$

$$p1=p0$$

$$y[k]=z1$$

where:
c=2^9*r*cos(a) and s=2^9*r*sin(a) are integer representations of the couple form multiplicative constants, referred to herein as "c" and "s" parameters;
z1, p1, and p0 are values of nodes in the coupled form denominator structure; and
m is a pre-filter multiplier designed to reduce signal distortion from integer quantization within the filter.

Alternatively, a standard coupled form structure is implemented using different logic and/or precision.

Figure 6:
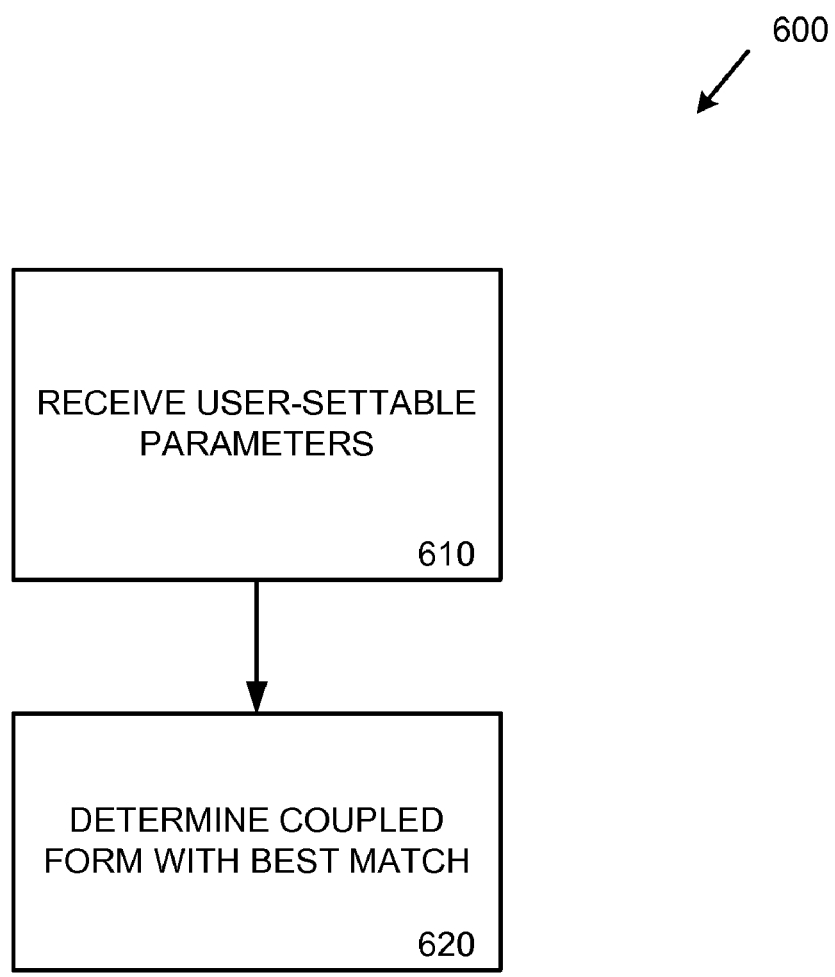
FIG. 6 depicts an example method for selecting between standard and modified coupled form structures.

The example implementation of a standard coupled form structure described above is based on the coupled form illustrated in Figure 6.43 from "Discrete-Time Signal Processing" by Oppenheim & Schafer, Prentice-Hall 1999, second edition ("Oppenheim"). Figure 6.43 from Oppenheim illustrates an example of a signal flow diagram representing pseudocode for an example implementation of a standard coupled form.

B. User-Settable Parameters

In some implementations, bass boost can be configured by a user (e.g., a user of an audio playback system). For example, the user can provide bass boost parameters which can be used for controlling bass boost (e.g., used as coefficients of an integer bass boost filter of the audio playback system). Bass boost parameters that are provided directly or indirectly by a user can be called user-settable parameters.

Bass boost parameters can be provided by a user in a variety of ways. For example, the user can enter bass boost parameters using a user interface (e.g., a user interface produced by an audio playback system). The user interface can provide user interface elements, such as entry boxes, sliders, drop-down lists, wizards, or other types of user interface elements, for receiving the bass boost parameters from the user.

The following example table (Table 1) describes available boost frequencies and amounts as a function of the integer representations of the pole's real and imaginary components (parameters "c", "s"), using standard coupled form structure. The "c" parameter in Table 1 is a linear function derived from the pole's real component, and will be converted to the pole's real part using a simple translation before bass boost filtering is applied. In a particular embodiment, 9 precision bits can be generally sufficient to allow reasonable flexibility in the peak frequency selection.

TABLE 1

Boost amount (dB) @ boost center frequency (Hz) (for 44 kHz sampling)

| S | c = 1 | c = 2 | c = 3 |
|---|---|---|---|
| 2 | 2.0 @ 40 | | |
| 3 | 4.5 @ 48 | | |
| 4 | 6.7 @ 60 | 2.0 @ 79 | |
| 5 | 8.5 @ 73 | 3.4 @ 87 | |
| 6 | 10.1 @ 85 | 4.6 @ 96 | 2.1 @ 118 |
| 7 | 11.5 @ 99 | 5.8 @ 108 | 3.0 @ 124 |
| 8 | 12.7 @ 112 | 6.8 @ 120 | 3.9 @ 134 |
| 9 | 13.9 @ 126 | 7.8 @ 133 | 4.7 @ 144 |
| 10 | 15.0 @ 139 | 8.8 @ 145 | 5.5 @ 155 |
| 11 | 16.0 @ 152 | 9.6 @ 158 | 6.3 @ 168 |
| 12 | 16.9 @ 166 | 10.4 @ 171 | 7.0 @ 179 |
| 13 | 17.9 @ 180 | 11.2 @ 184 | 7.7 @ 192 |
| 14 | 18.8 @ 193 | 11.9 @ 197 | 8.3 @ 204 |
| 15 | 19.7 @ 206 | 12.7 @ 211 | 9.0 @ 217 |
| 16 | 20.6 @ 221 | 13.4 @ 224 | 9.6 @ 229 |
| 17 | 21.5 @ 235 | 14.0 @ 237 | 10.2 @ 244 |
| 18 | 22.4 @ 248 | 14.7 @ 252 | 10.8 @ 257 |
| 19 | 23.4 @ 261 | 15.3 @ 266 | 11.3 @ 269 |
| 20 | 24.3 @ 276 | 16.0 @ 278 | 11.9 @ 281 |

In some implementations, a user can provide "c" and "s" user-settable parameters for controlling bass boost. A user interface can display user interface elements for receiving "c" and "s" parameters directly (e.g., without translation) from a user of the user interface. For example, the user interface can display a slider user interface element allowing the user to select a "c" parameter value from 1 to 3, and another slider user interface element allowing the user to select an "s" parameter value from 2 to 20 (corresponding to the values in Table 1 above). Illustrating a specific example, if a user sets the "c" parameter slider to 2, and the "s" parameter slider to 17, then a bass boost of 14 dB at 237 Hz can be implemented (e.g., an integer bass boost filter can receive the "c" and "s" parameters and use them to filter an input audio signal with a bass boost curve using a coupled form structure, such as a standard coupled form structure, to produce a bass boosted output audio signal).

Instead of providing both "c" and "s" user-settable parameters, a user can provide one or the other. For example, the value of "c" can be fixed (e.g., at 2), and the user can provide only the "s" value.

In other implementations, a user can provide bass boost parameters other than direct "c" and/or "s" values. For example, the user can provide a desired peak boost frequency and then be provided with available boost amounts. To illustrate this example, if a user selects a desired peak boost frequency of 180 Hz, then the user interface can display available boost amounts close to 180 Hz. Using Table 1 above, the user interface can display available bass boost amounts of 17.9 dB, 11.2 dB, and 7.0 dB (corresponding to c=1, 2, and 3, respectively).

In yet other implementations, the user can provide bass boost parameters other than direct "c" and/or "s" values and the "c" and "s" values can be determined using simple translation. For example, the "s" parameter can be obtained directly from a desired peak boost frequency (e.g., entered by a user) using an approximation, e.g., s=(f+7)/13 (or another approximation, such as a more complex approximation if additional accuracy is desired). Similarly, the "c" parameter can be obtained from a desired boost amount (e.g., entered by a user) using an approximation given the boost amount at a given frequency. Bass boost can therefore be implemented using code with integer approximations for c and s, for example:

```
Void filter(int x[ ], int y[ ], float fHz, float fBoostDB)
{
    Int s = (f + 7) / 13;
    Int c = // Table 1, or some other approximation or table lookup;
    c = (1 << 9) – c;
    for (every input sample in x[ ])
    {
        P0 = m * (x[k] + x[k–2] – 2 *x[k–1]) – ((s * z1) >> 9) +
             ((c * p1) >> 9);
        z1 = ((s * p1) >> 9) + ((c * z1) >> 9);
        p1 = p0;
        y[k] = z1;
    }
}
```

Alternatively, an integer implementation of bass boost with a standard coupled form uses different logic, precision and/or integer approximations.

C. Modified Coupled Form

Using 9 bits of precision (which, in some architectures, is a practical limit for reasonable noise performance with no multiplication overflows) allows very limited choices of the bass boost amount in some implementations. Table 1 shows three choices for c. For example, at 270 Hz, the choices, as integer approximations, are 24 dB (c=1), 16 dB (c=2), or 12 dB (c=3). It can be desirable in audio applications to have more granular control of the bass boost amount.

Consider the following coupled form structure which is an example implementation of a modified coupled form structure, which is different from the example implementation of a standard coupled form structure defined in section III(A) above.

$$p1=m*(x[k]+x[k-2]-2*x[k-1])-((s*z1)>>9)+((c*p1)>>9)$$

$$z1=((s*p1)>>9)+((c*z1)>>9)$$

$$y[k]=z1$$

Compared to the original denominator structure implementation described in section III(A) above (which was $y[k]-2*r*\cos(a)*y[k-1]+r*r*y[k-2]$), the example implementation of a modified coupled form structure implements a different denominator:

$$y[k]+((r*\sin(a))^2-2*r*\cos(a))*y[k-1]+(r*\cos(a))^2*y[k-2]$$

Figure 4:
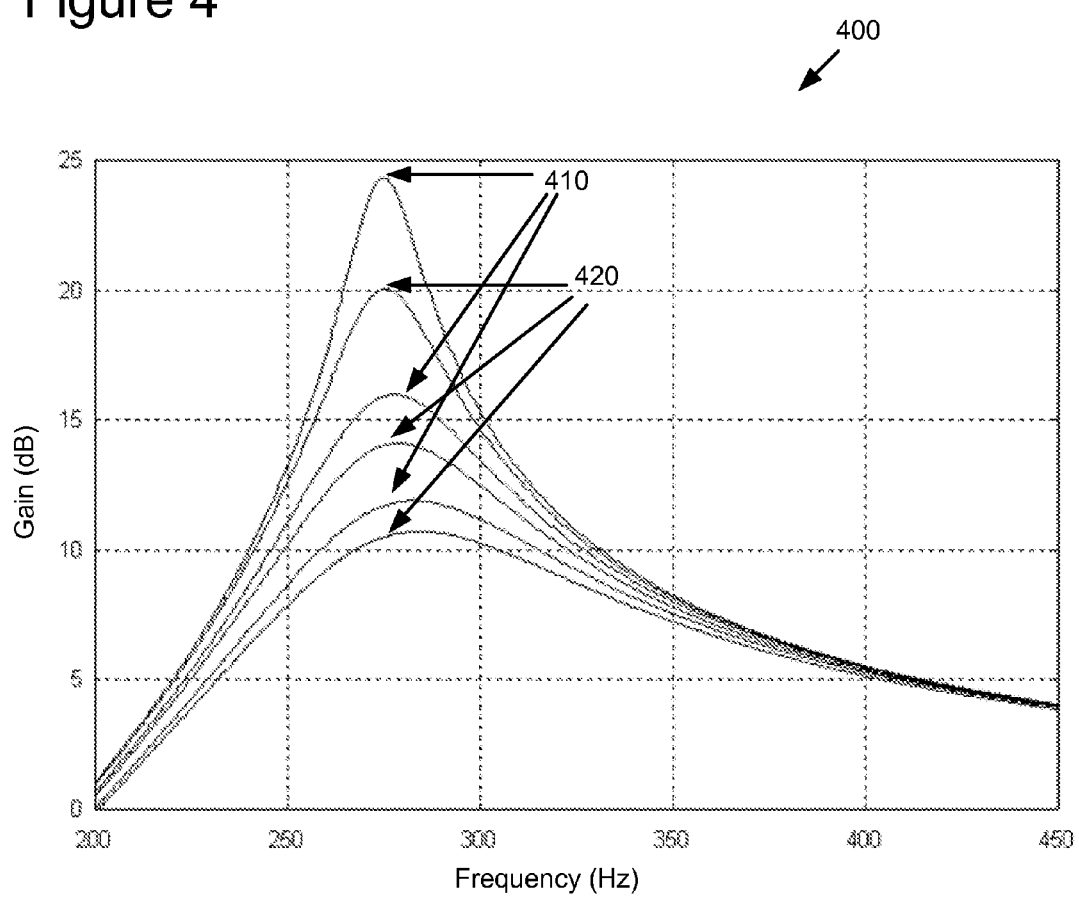
FIG. 4 depicts examples of frequency response curves using original and modified coupled form denominators for bass boost.

This modified denominator, for different integer values of $r*\cos(a)$, provides a set of amplitude frequency responses that fall approximately half way between what can be obtained using the same integer values of $r*\cos(a)$ with the corresponding standard coupled form structure described above. For example, for a particular choice of the "s" coefficient (peak frequency), the family of frequency responses possible with the example standard coupled form 410 and example modified coupled form 420 denominators are shown in the curves 400 of FIG. 4.

Using such a standard coupled form structure and such a modified coupled form structure together, it is possible to implement an integer bass boost filter which effectively approximates values of "c" in multiples of 0.5 rather than 1.0, providing more granularity in available bass boost curves. In some implementations, an integer bass boost filter can switch between using a standard coupled form structure and a modified coupled form structure depending on which would produce a bass boost curve that best matches desired parameters entered by a user (e.g., a desired peak boost frequency and/or a desired boost amount). For example, the following code will switch between example implementations of standard and modified coupled form structures depending on the value of cParam (a value entered by a user indicating desired boost amount; a cParam value of 1.0, 2.0, or 3.0 will use standard coupled form implementation and a cParam value of 1.5, 2.5, or 3.5 will use modified coupled form implementation).

```
Void filter(int x[ ], int y[ ], float cParam) // cParam is a multiple of 0.5
{
   Int c = round(cParam * 2) ;
   Bool fModified = (c % 2);
   c = c / 2;
   c = (1 <<9 ) – c;
   for (every input sample in x[ ])
   {
      P0 = k * (x[k] + x[k–2] – 2 *x[k–1]) – ((s * z1) >> 9) +
       ((c * p1) >> 9);
      If (fModified)
         P1 = p0;
      z1 = ((s * p1) >> 9) + ((c * z1) >> 9);
      p1 = p0;
      y[k] = z1;
   }
}
```

In the above code, having cParam greater than or equal to 1.0 helps avoid undesirable results. For example, a cParam value of 0.5 can result in the filter being unstable (depending on values of "s"). The above code will also operate with values of cParam that are not multiples of 0.5 because the "round(cParam*2)" function will convert cParam to a multiple of 0.5 (scaled by 2). For example, cParam values of 1.5 and 1.4 will both result in a "c" value of 3.

In the above code, the value of modified will determine whether the standard or modified coupled form implementation is used. Specifically, if the value of "c" is even, then "c % 2" will evaluate to 0 (false) and standard coupled form implementation will be used. If the value of "c" is odd, then "c % 2" will evaluate to 1 (true) and modified coupled form implementation will be used.

Figure 5:
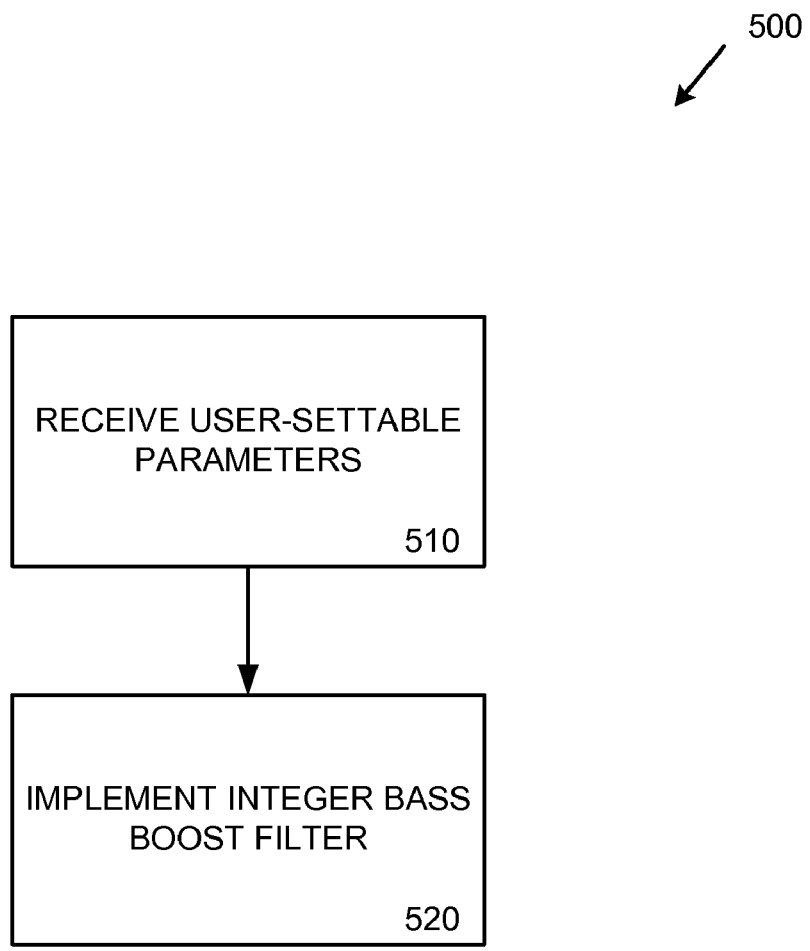
FIG. 5 depicts an example method for boosting bass frequencies of audio.

FIG. 5 depicts an example method 500 of boosting bass frequencies of audio using an integer bass boost filter. At 510, user-settable parameters for controlling bass boost are received. For example, the user-settable parameters can comprise "c" and "s" coefficients (e.g., entered directly by a user via a user interface). User-settable parameters other than direct "c" and "s" values can also be received. For example, a user can enter a desired boost amount and/or a desired peak boost frequency and from these values "c" and/or "s" values can be calculated using simple translation (e.g., using the example code above).

At 520, the integer bass boost filter is implemented using a coupled form structure and using the received user-settable parameters. For example, a standard coupled form structure can be used in implementing the integer bass boost filter (e.g., using received "c" and "s" user-settable parameters). Alternatively, a modified coupled form structure can be used, or a combination of standard and modified coupled form structures (e.g., selecting between implementations of standard and modified coupled form structure depending on the received user-settable parameters) can be used. The integer bass boost filter can be applied to an input audio signal to produce an output audio signal with bass frequencies boosted by the integer bass boost filter. Alternatively, an audio tool uses user-settable parameters to adjust bass boost using a non-integer bass boost filter (e.g., a bass boost filter implemented partially or fully using floating point math).

FIG. 6 depicts an example method 600 of switching between implementations of standard and modified coupled form structures for boosting bass frequencies of audio using an integer bass boost filter. For example, the integer bass boost filter can be configured to use implementations of a standard coupled form structure as well as implementations of a modified coupled form structure. The integer bass boost filter can switch between using implementations of standard or modified coupled form structures depending on received user-settable parameters.

At 610, one or more user-settable parameters are received. For example, a desired bass boost amount user-settable parameter can be received. At 620, a determination is made to use an implementation of a standard or modified coupled form structure. For example, a selection can be made between implementations of standard and modified coupled form structures depending on which would produce a bass boost curve that best matches the desired bass boost amount.

Alternatively, an implementation of bass boost that switches between different denominator forms uses different logic and/or precision. Or, an audio tool switches between implementations of standard and modified coupled form structures in a non-integer bass boost filter.

D. Linear Combination of High-Pass Filter Output and Original Input

Figure 7:
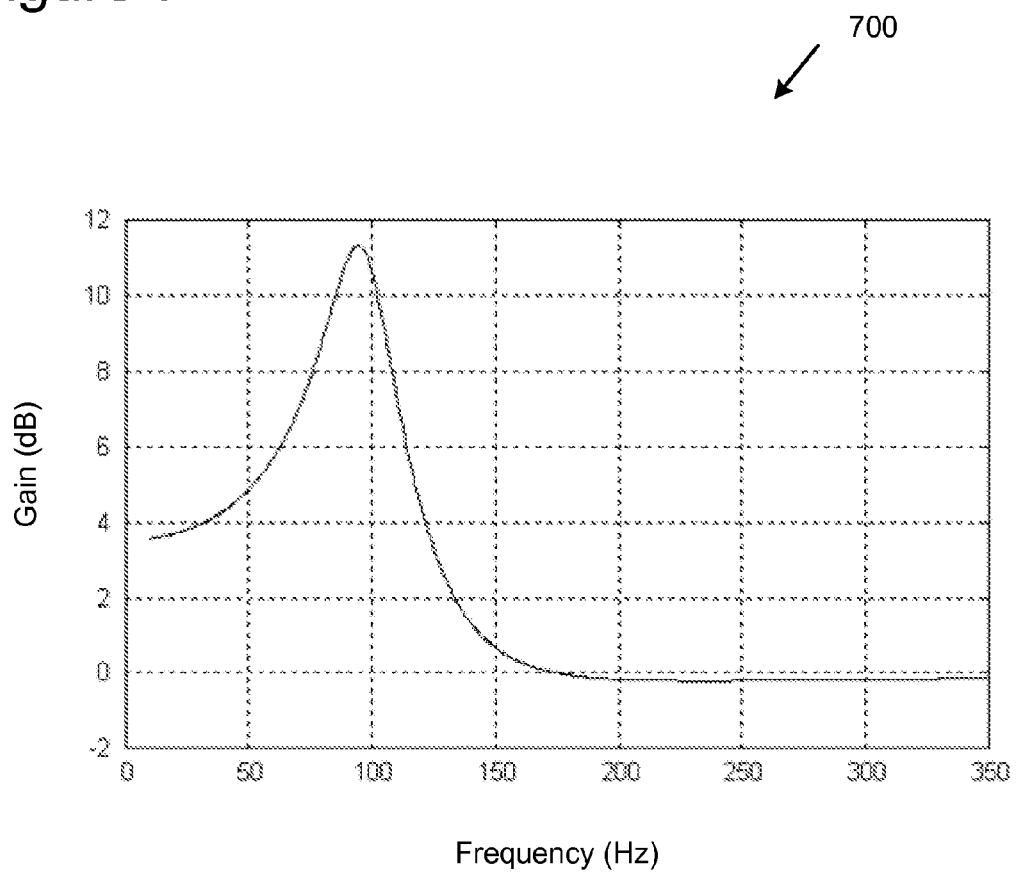
FIG. 7 depicts an example frequency response curve of a linear combination of high-pass filter output and original input for bass boost.

In some applications, it can be desirable to maintain some amount of bass boost even for frequencies lower than the peak boost frequency. Curves, such as the curve 700 depicted in FIG. 7, can be created, for example, by using a numerator that is a linear combination of [1,–2, 1] (the numerator described in section III(A) above) and the denominator. If Y(z)/X(z) is the transfer function of the filter producing the curve shown in FIG. 3, its complement, (Y(z)–X(z))/Y(z), is a high-pass filter (Y(z) and X(z) are polynomials for the numerator and denominator, respectively).

Figure 8:
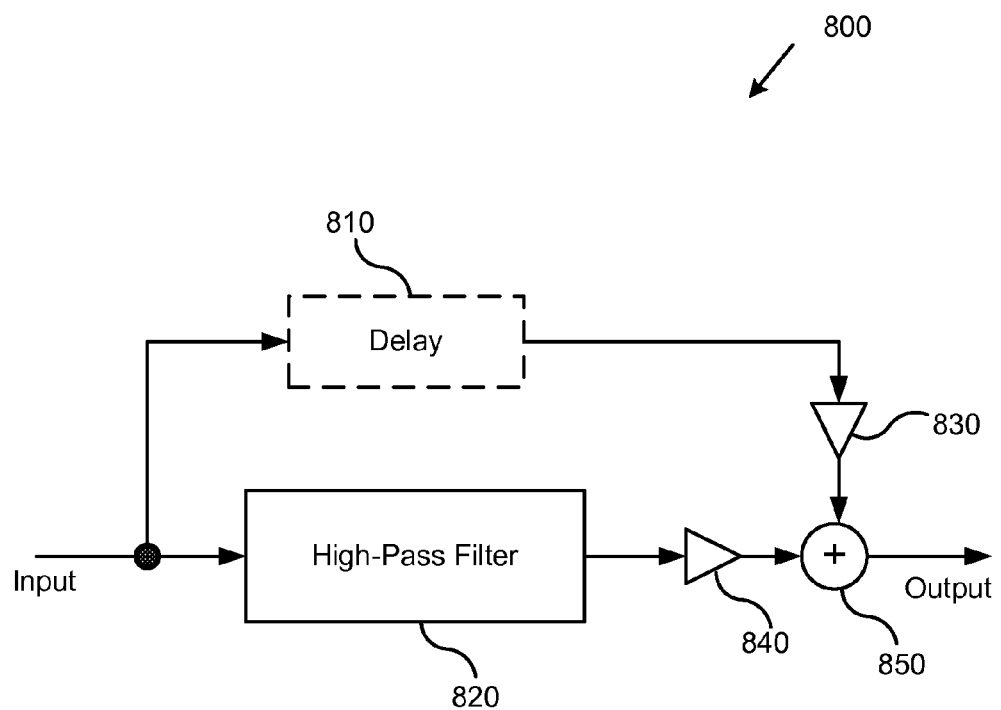
FIG. 8 depicts an example block diagram of a linear combination of high-pass filter output and original input.

FIG. 8 depicts a block diagram 800 for an implementation of a linear combination of high-pass filter output and original input. For example, the block diagram 800 can be implemented by an audio playback device to boost low frequencies arbitrarily by using a linear combination of high-pass filter output and original input. In the block diagram 800, an input audio signal is split into two paths. The lower path passes through a high-pass filter 820 (e.g., a filter implemented using a standard coupled form or a modified coupled form) and then through a gain device 840. Depending on whether the standard coupled form implementation or modified coupled form implementation is used for the high-pass filter 820, a delay 810 may be needed for the upper path. If the high-pass filter 820 uses a standard coupled form implementation, then the delay 810 will be used (e.g., the delay 810 will be needed to ensure proper operation of the filter when using a standard coupled form implementation). However, if the high-pass filter 820 uses a modified coupled form implementation, then the delay 810 is not used (e.g., when using a modified coupled form implementation, the filter operates properly without requiring the delay 810). Regardless of whether a delay 810 is used in the upper path, the upper path will then proceed through a gain device 830. In some implementations, to achieve bass boost, the gain of 830 is larger than the gain of

840. For example, if the gain of 830 is "a," then the gain of 840 can be "1−a" (where a >=1). At 850, the two paths are combined (e.g., using an adder) producing an output audio signal.

Figure 9:
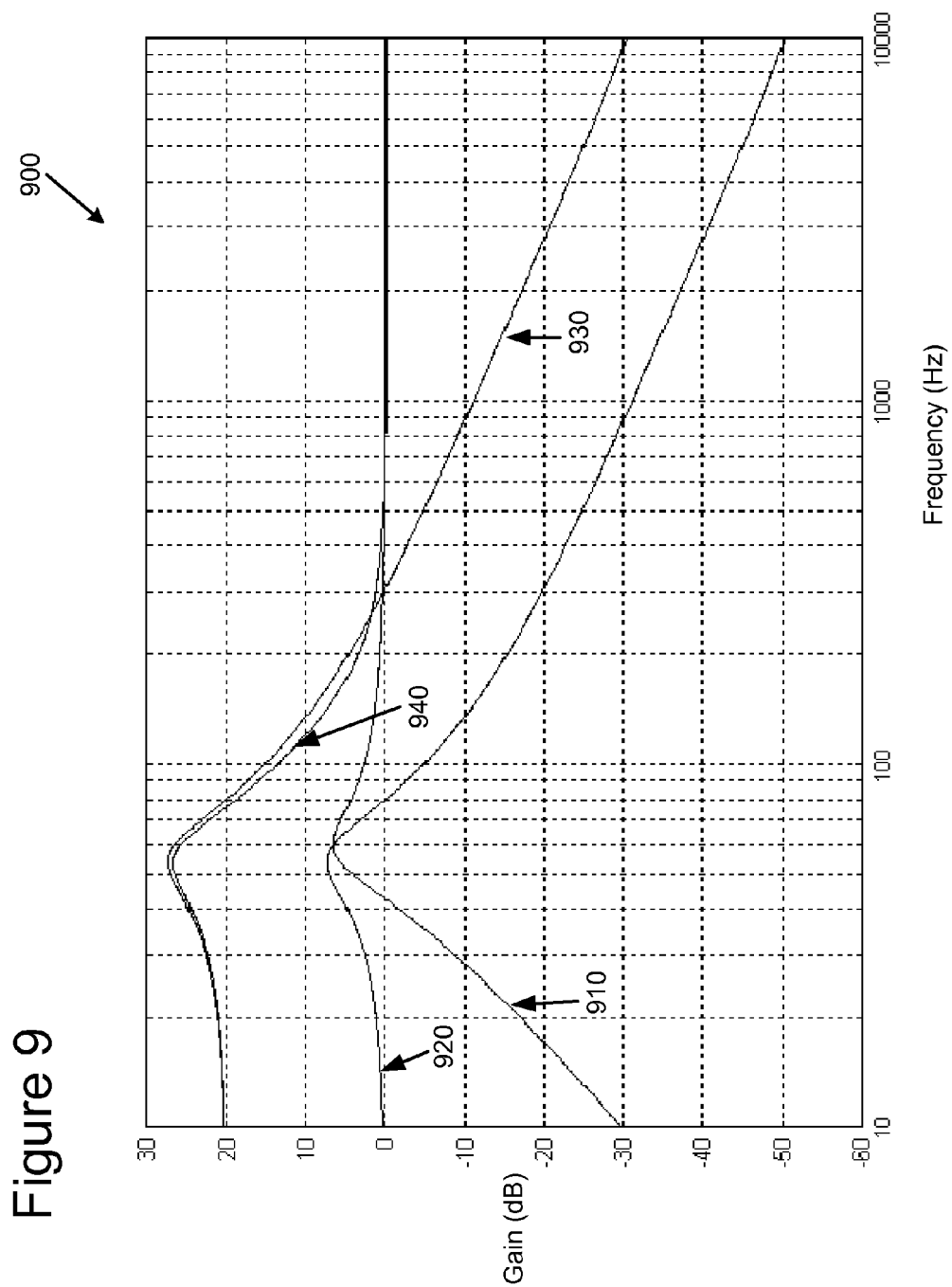
FIG. 9 depicts example frequency response curves illustrating a linear combination of high-pass filter output and original input.

FIG. 9 depicts example frequency response curves 900 illustrating a linear combination of high-pass filter output and original input in some implementations. Frequency response curve 910 is for the high-pass filter output, based on the transfer function Y(z)/X(z). Frequency response curve 920 is for the input minus the high-pass filter output, based on a transfer function of 1−Y(z)/X(z). Note that this is a low-pass filter. Frequency response curve 930 is for the low-pass filter scaled up by a desired gain (10 in this figure), based on transfer function: 10*(1−Y(z)/X(z)). Frequency response curve 940 is for the sum of curves 930 and 910; it's based on the transfer function that is the sum of Y(z)/X(z) and 10*(1−Y(z)/X(z)), which can be rewritten as 10−9*Y(z)/X(z) and thus implemented with an adder with 2 scaled inputs.

E. Combined Implementation

Figure 10:
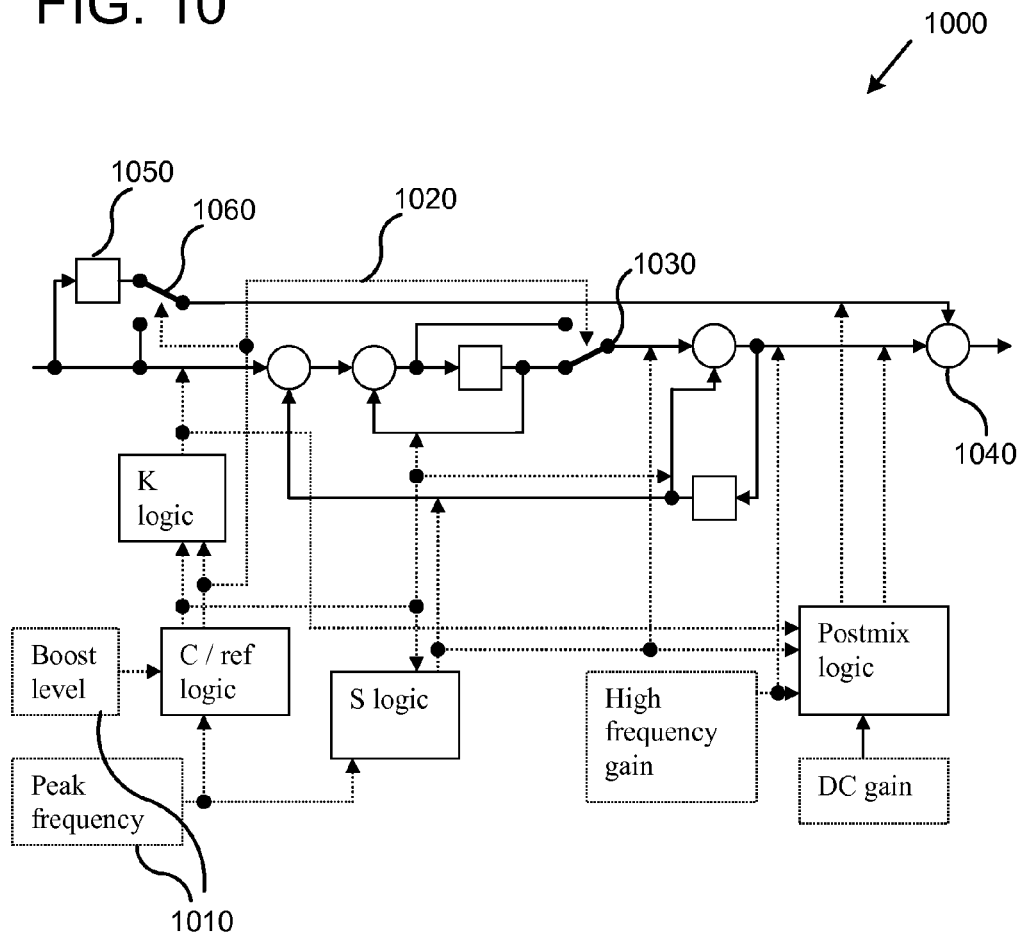
FIG. 10 depicts an example combined implementation.

A combined implementation of an integer bass boost filter using implementations of a standard coupled form and implementations of a modified coupled form along with a linear combination of high-pass filter output and original input can be created. FIG. 10 depicts an example combined implementation 1000. In the combined implementation 1000, a circle denotes addition, a square denotes a 1-sample delay, a solid line is a signal line, a dashed line is a coefficient or boolean line (set at initialization time, constant afterwards), a dashed line pointing into a solid line denotes multiplication by coefficient, and a dashed line pointing into a switch denotes multiplexing.

In the combined implementation 1000, "c" and "s" parameters are received 1010, either directly or using simple translation. Depending on the values of "c" and/or "s," a standard coupled form or modified coupled form implementation will be used by the integer bass boost filter. The "ref" line 1020 coming out of the "C/ref logic" box indicates whether standard or modified coupled implementation form is used. A ref value of "0" means that modified coupled form implementation is used, and a ref value of "1" means that standard coupled form implementation is used. Note how the "ref" line 1020 controls the filter structure by controlling switch 1030. In the combined implementation 1000, the linear combination of high-pass filter output and original input occurs at the adder 1040 and the "Postmix logic" box which controls the gains of the two signals (high-pass filter output and original input) feeding into the adder 1040. Depending on whether standard or modified coupled form implementation is used, a 1-sample delay 1050 may be needed. If the ref value is "1" (standard coupled form implementation is used), then the ref line 1020 will control switch 1060 to add the 1-sample delay 1050. If the ref value is "0" (modified coupled form implementation is used), then the ref line 1020 will control switch 1060 to remove the 1-sample delay 1050.

F. Dynamic Bass Boost Filter

In specific implementations described herein, bass frequencies of audio are dynamically boosted using, at least in part, a linear combination of input signal and high-pass filter output. For example, the gain can be dynamically applied to the input signal and high-pass filter output.

Instead of applying a linear combination of input signal and high-pass filter output to create a static (or fixed) bass boost filter (a linear filter), a linear combination of input signal and high-pass filter output can be used as part of a dynamic bass boost filter. Section III(D) above, along with FIGS. 7, 8, and 9, describes implementations of a linear combination of high-pass filter output and original input. A dynamic bass boost filter (e.g., a self-adjusting bass boost filter) can be beneficial because it allows the amount of boost to vary based on characteristics of the source material. For example, a dynamic bass boost filter can vary the amount of bass boost so that a similar bass level is present regardless of the bass level of the source material.

A dynamic bass boost filter can be implemented as an integer filter. In general, a dynamic integer bass boost filter is any implementation of a filter that dynamically boosts bass frequencies of an audio signal.

An equation can be used to apply a linear combination of the input signal and the high-pass filter output. The following linear combination equation applies an arbitrary amount of bass boost using a linear combination, with the amount controlled by the boost_multiplier (e.g., a boost_multiplier of 2 is 2× boost (6 dB), and a boost_multiplier of 4 is 4× (12 dB).

$$Out=boost\_multiplier*(in-HP)+HP$$

(where "HP" denotes the output of the high-pass filter, "in" denotes the original input, and "out" denotes boosted output; note that "in−HP" is a low-pass-filtered signal).

For example, the following linear combination equation applies bass boost of 2× (6 dB):

$$Out=2*(in-HP)+HP=2*in-1*HP$$

In order to obtain a low frequency portion of a signal, so that the low frequency portion can be boosted, an explicit low-pass filter could be used. However, the low-frequency portion can also be obtained using a complement of a high-pass filter. In some situations, using a high-pass filter instead of an explicit low-pass filter simplifies the implementation of the bass boost filter. Additionally, using a high-pass filter can result in more desirable phase cancellation behavior (e.g., at 1170) than using a low-pass filter of similar complexity. The output of the high-pass filter can be combined with the input signal in two different ways to obtain (a) a low frequency energy estimator used for driving the compressor and (b) the bass-boosting compressor output.

Figure 11:
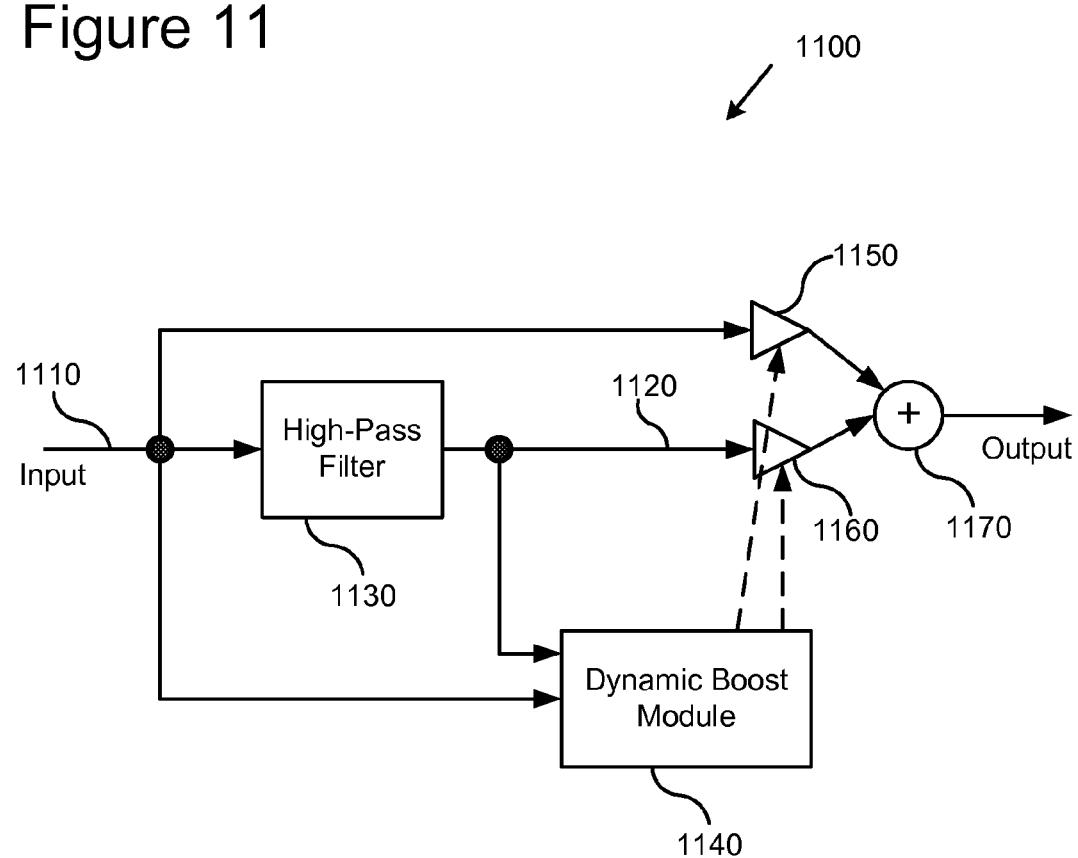
FIG. 11 depicts an example block diagram of a bass boost filter with a dynamic boost module.

FIG. 11 depicts a block diagram 1100 of a dynamic bass boost filter (e.g., a dynamic integer bass boost filter) with a dynamic boost module 1140. The bass boost filter depicted in the block diagram 1100 is implemented in part using a linear combination of high-pass filter output and original input. The block diagram 1100 can be implemented by an audio playback device to dynamically boost low frequencies based on the bass level of an input audio signal.

In the diagram 1100, a high-pass filter 1130 receives an input signal 1110 and produces an output of the high-pass filter 1120. The input signal 1110 is combined with the output of the high-pass filter 1120 by the adder 1170 in order to create a bass boosted output signal. The bass boost filter depicted in the diagram 1100 implements the linear combination by applying gain to the input signal 1110 and the output of the high-pass filter 1120 using a first gain device 1150 (for applying gain to the input signal 1110) and a second gain device 1160 (for applying gain to the output of the high-pass filter 1120), and then combining (e.g., adding) the gain-adjusted signals 1170.

The amount of boost is controlled by applying gain (e.g., different gain) to each of the original input signal 1110 and the output of the high-pass filter 1120 before they are combined 1170. For example, the linear combination equation discussed above describes one way of calculating the gain to apply to the input and high-pass output signals.

In the dynamic bass boost filter depicted in the diagram 1100, the amount of boost is controlled dynamically by the dynamic boost module 1140. The dynamic boost module 1140 receives the input signal 1110 and the output of the high-pass filter 1120. The dynamic boost module controls gain elements 1150 and 1160 in order to boost bass frequencies of the audio using a linear combination of input and high-pass output (e.g., using the linear combination equation discussed above). In a specific implementation, the dynamic boost module 1140 is configured to determine a target gain amount based at least in part upon a target level and the current level and, based at least in part on the target gain amount, dynamically adjust the input signal gain 1150 and high-pass output signal gain 1160. In some implementations, the dynamic boost module 1140 applies attack/release logic to smooth the target gain fluctuations.

Figure 12:
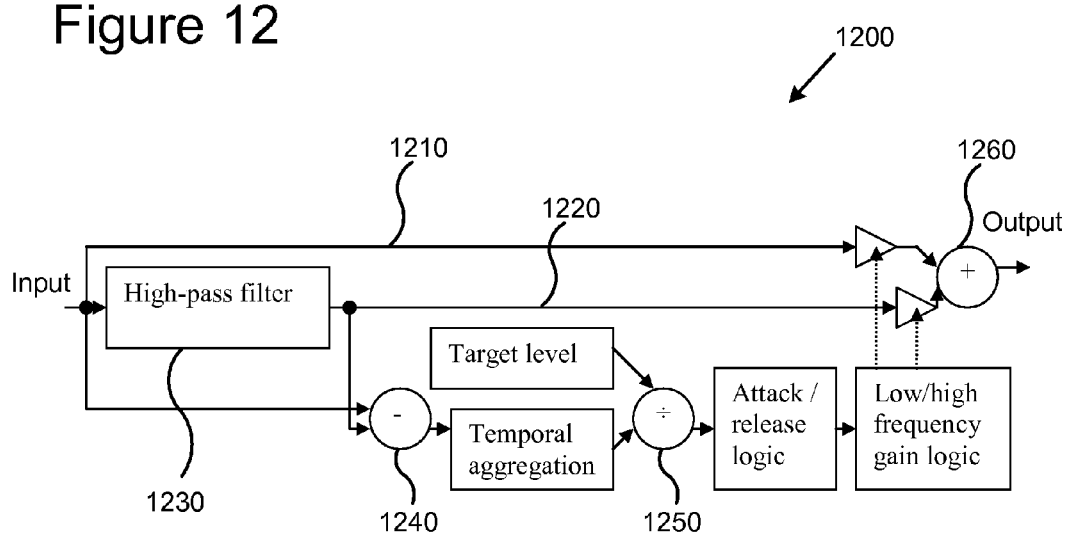
FIG. 12 depicts an example block diagram of a dynamic bass boost filter.

FIG. 12 depicts a block diagram 1200 of a dynamic bass boost filter (e.g., a dynamic integer bass boost filter) implemented in part using a linear combination of high-pass filter output and original input. For example, the block diagram 1200 can be implemented by an audio playback device to dynamically boost low frequencies based on the bass level of an input audio signal.

In the dynamic bass boost filter depicted in the diagram 1200, a high-pass filter 1230 receives an input signal 1210 and produces an output of the high-pass filter 1220. The original input signal 1210 is combined with the output of the high-pass filter 1220 by the adder 1260 in order to create a bass boosted output signal. The amount of boost is controlled by applying gain (e.g., different gain) to each of the original input signals 1210 and the output of the high-pass filter 1220 just before they are combined 1260. In the example filter 1200, the amount of boost is controlled dynamically. A low-frequency portion of the signal (which is a measure of the bass level of the input signal) is obtained 1240 by subtracting the output of the high-pass filter 1220 from the original input signal 1210. The low-frequency portion of the signal can be called a current level or a current bass level. Using a target level, and an aggregated current level (e.g., an average of multiple current levels obtained by 1240), a ratio is obtained 1250 and a target gain is calculated. The target gain is translated into a current gain amount (an instantaneous current gain amount). For example, the current gain amount can represent an average of the target gain over time. Low/high frequency gain logic then applies the current gain amount by controlling the gain controls for the original input 1210 and high-pass filter output 1220.

In a specific implementation, the low/high frequency gain logic uses the linear combination equation discussed above (Out=boost_multiplier*(in−HP)+HP) to translate the current gain amount into gains applied to the "in" (1210) and "HP" (1220) signals.

The target gain amount is, in a long term sense, the ratio of the desired target bass level to the bass level present in the input signal (in some implementations, the ratio is raised to a power between 0 and 1 to achieve partial compression of the bass band, rather than full compression).

Problems can occur if the bass boost level adjustment is configured to respond to every input sample value immediately. For example, responding to every input sample immediately can lead to a highly non-linear operation resulting in massive harmonic and intermodulation distortion. In a specific implementation, this problem is solved by averaging the input samples (e.g., PCM input sample values) over time. In a specific implementation, attack/release logic (e.g., as is typical found in audio compressors) is used to smooth the bass gain fluctuations (e.g., to smooth the target gain amount so it so that it does not vary drastically, but rather gradually, from one sample to the next). Using attack/release logic, the target gain is translated into the current gain amount. Additionally, temporal aggregation of multiple input samples can be used to avoid performing the expensive division operation for every sample (this temporal aggregation can also contribute to the smoothing effect).

In a specific implementation, the attack/release logic is implemented as follows:
if target gain<current gain current gain=current gain−(current gain−target gain)*$a$ else current gain=current gain+(target gain−current gain)*$b$ Where "a" and "b" are constants. In a specific implementation, "a"=1 and "b"=$\frac{1}{64}$ (note that the meaning and scale of a and b depend on how frequently attack/release logic is applied). In some implementations, to save computational resources, attack/release logic is applied once per N samples, and between the applications of attack/release current gain follows a linear trajectory.

Figure 13:
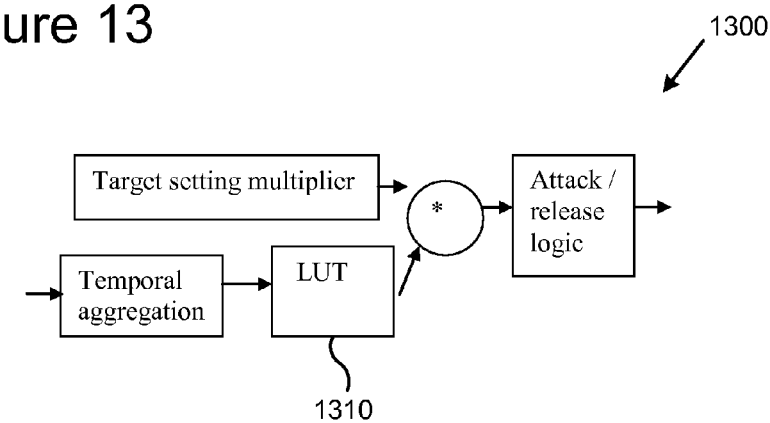
FIG. 13 depicts an example block diagram of a portion of a dynamic bass boost filter using a lookup table.

In some implementations, the computationally expensive division operation 1250 can be replaced with a lookup table. FIG. 13 depicts an example block diagram of a portion of a dynamic bass boost filter using a lookup table. Instead of the target level and division operation 1250 of FIG. 12, a target setting multiplier and lookup table 1310 can be used. The target level in this case can optionally be encoded implicitly in the scale of the lookup table. If different target levels need to be accommodated (e.g., to accommodate a user setting for different bass boost "levels"), the output of table lookup can be multiplied by an adjustment factor derived from the desired bass boost level. The resolution requirement for such a lookup table 1310 is primarily driven by what happens for low input bass levels. For example, insufficient resolution would lead to a large range of low-level inputs all collapsing into one table entry, leading to substantial rounding errors in the resulting target bass gain.

A lookup table has the additional advantage of allowing the division output to undergo a further non-linear operation at no additional cost (the non-linear operation can be built into the lookup table). For example, it is common in audio compressors to raise the output of the division operation to some power between 0 and 1 (usually expressed as a compression ratio—e.g., 6:1 ratio would mean that the division output is raised to a power of 6/(6+1)=0.86). In a division-based implementation, the power operation incurs additional (often significant) computational cost. In a lookup table implementation, both operations (the division and the raising to a power) can be combined into a single lookup table.

Figure 14:
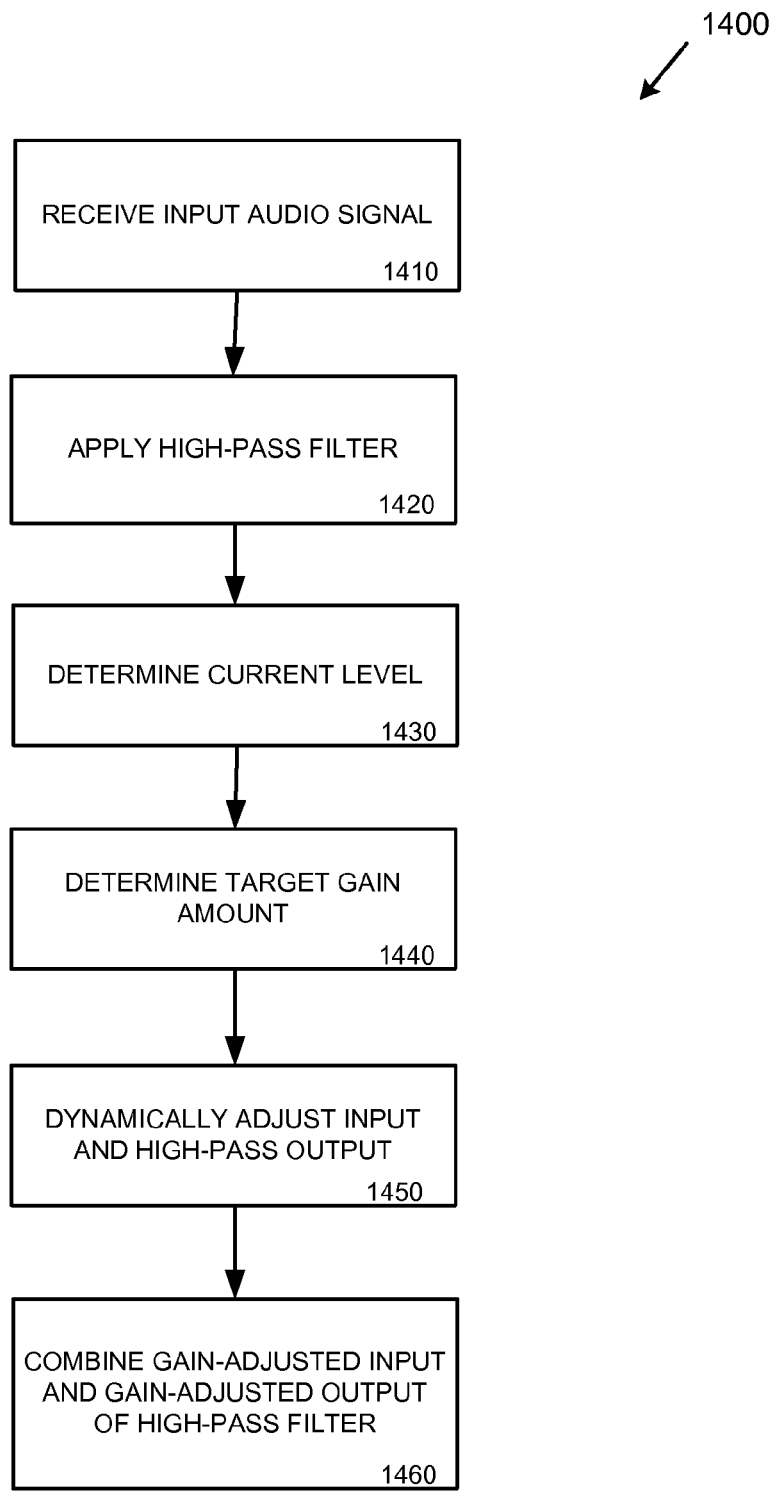
FIG. 14 depicts an example method for dynamically boosting bass frequencies of audio.

FIG. 14 depicts an example method 1400 for dynamically boosting bass frequencies of audio. For example, the method 1400 can be implemented using a dynamic bass boost filter such as depicted in FIGS. 11-13.

At 1410, an input audio signal is received. At 1420, a high-pass filter is applied to the input audio signal to produce an output of the high-pass filter. At 1430, a current level is determined by subtracting the output of the high-pass filter from the input audio signal. The current level reflects the bass level in the input signal (a current bass level). In some implementations, the current level is an aggregate level generated from multiple input samples.

At 1440, a target gain amount is determined based at least in part upon a target level and the current level. In some implementations, a current gain amount is determined based at least in part upon the target gain amount and a previous current gain amount. For example, the current gain amount can be determined based on attack/release logic (e.g., the attack/release logic can be implemented as described above in this section).

In a specific implementation, the high-pass filter is implemented using a coupled form structure implementation (e.g., standard coupled form structure implementation, modified coupled form structure implementation, or a combination).

At 1450, the output of the high-pass filter and the input audio signal are dynamically adjusted based at least in part on the target gain amount. In a specific implementation, the output of the high-pass filter is adjusted by a first gain and the input audio signal by a second gain (e.g., the first and second gain can be adjusted based on the linear combination equation, out=boost_multiplier*(in−HP)+HP, described above).

In a specific implementation where a current gain amount is determined, the dynamic adjustment is based on the current gain amount (which is in turn based on the target gain amount). Calculating a current gain amount based on the target gain amount, and using the current gain amount for the dynamic adjustments, can provide for smoother (e.g., more gradual) gain changes (e.g., by applying attack/release logic).

At 1460, an output audio signal is produced by combining (e.g., adding) the gain-adjusted input audio signal and the gain-adjusted output of the high-pass filter.

G. Adaptive Output Gain

In some scenarios, it is generally desirable for a bass boost filter to have a gain of 1 at medium and high frequencies. This can help avoid substantial level changes when boost is turned on/off.

Under such constraints, bass boost implies a gain of significantly greater than 1 at low frequencies. To achieve this result without clipping (distortion), the bass boost filter can be followed by an adaptive gain stage implemented, for example, as shown in the following pseudocode:

```
Scan the next block if input, noting its maximum PCM value
Find the maximum gain that could be applied to the next block
   without 16-bit output overflows
If the maximum gain found in the previous step exceeds the
current gain
    Determine the gain that would exist at the end of the
    current block if the gain were to be increased at the
    "release rate" over the course of the current block
    Check if the gain that would exist at the end of the
    current block multiplied by the larger of {the maximum
    input PCM value of the current block, the maximum input PCM
    value of the next block} would lead to an integer overflow
    If no integer overflow in the previous step
        Prepare to release (increase) the gain over the
        current block at "release rate"
    Else
        Prepare to decrease the gain over the current block
        at a rate ("attack rate") such that the gain at the
        end of the current block multiplied by the maximum
        input PCM value of the next block does not result in
        overflow
Process the current block, applying a gain to each sample,
    adjusting the gain after each sample according to either "attack
    rate" or "release rate" (or neither), as determined above
Shift blocks to the left by one ("current" block is produced as
    output, "next" block becomes "current", and a new input block is
    received as "next") and return to the top of this algorithm
```

The above logic operates on two adjacent blocks of audio data at a time: the "next" block of data is used to "look into the future" to determine which way the gain should be adjusted, and the "current" block is the one that gain is applied to (i.e., if the audio stream consists of blocks A, B, C, D, E, . . . , the above pseudocode would be first applied to blocks A and B, then to blocks B and C, then to blocks C and D, and so on).

Alternatively, the adaptive output gain follows different timing (e.g. not block-by-block) and/or applies a different look ahead.

Figure 15:
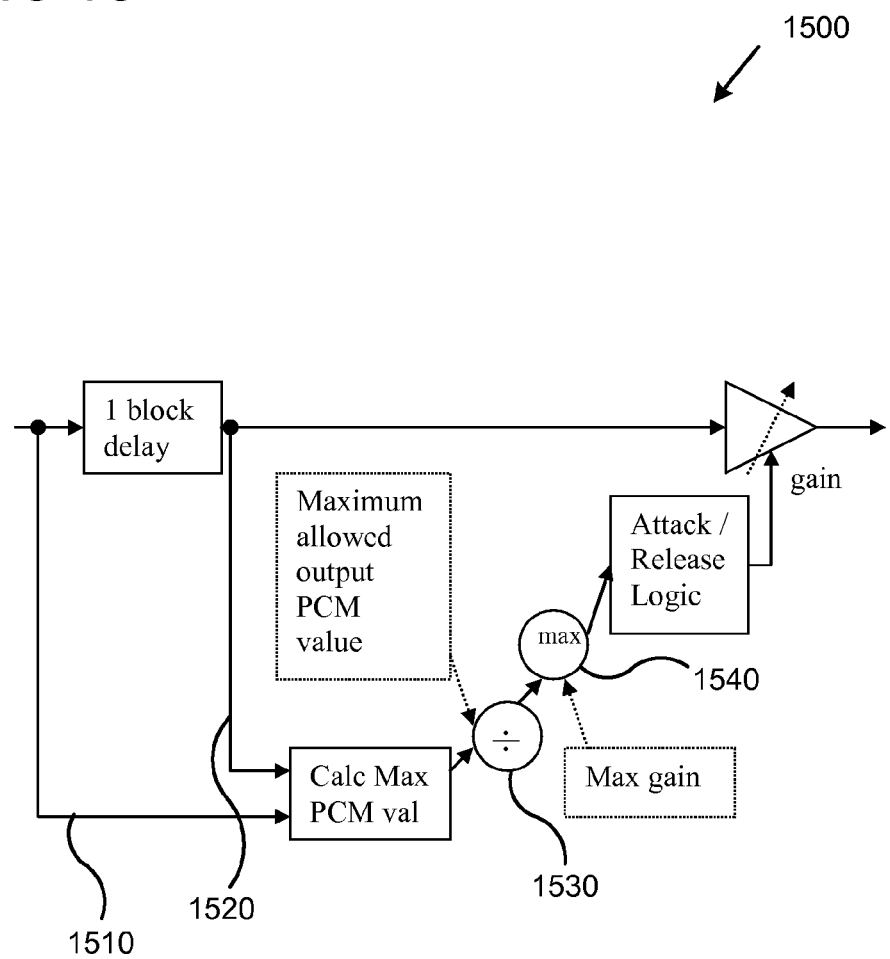
FIG. 15 depicts an example diagram of an adaptive output gain stage.

FIG. 15 illustrates an implementation of an adaptive output gain stage similar to the pseudocode above. FIG. 15 displays an example block-level diagram of an adaptive output gain circuit 1500. In the diagram, the current block 1510 and the previous block 1520 (delayed by 1) are received. The maximum gain that can be applied is calculated by dividing 1530 the maximum allowed PCM output value (e.g., maximum allowed output PCM value of 32767) by the maximum PCM value from the current block 1510 and the previous block 1520. The maximum gain that can be applied is then capped 1540. In general, the maximum gain that can be applied is capped at 1.0, but depending on the implementation a different cap may be appropriate (e.g., 2.0). Depending on the maximum gain that can be applied, the "attack/release logic" will control the gain applied to the audio signal. For example, the above pseudocode describes one way of implementing the attack/release logic.

The adaptive output gain stage 1500 can act, in some ways, as a limiter. It can reduce the signal when it is too loud, while not emphasizing the signal when it is quiet.

H. Soft Clipping

In some scenarios, it is generally desirable to implement soft clipping (e.g., integer soft clipping) in combination with a bass boost filter. Soft clipping can be used instead of the adaptive output gain stage described in section III(G) above. This section describes two integer soft clipping techniques, piecewise linear soft clipping and polynomial soft clipping.

In a specific implementation, the piecewise linear soft clipping technique maps all 32-bit signed integers (−2147483648 to +2147483647) to the signed 16-bit range (−32768 to +32767) in a way suitable for audio applications. First, the input value is constrained to the range −65535 to +65535 (values outside that range are hard-clipped, which is a reasonable choice for audio applications). The sign bit is removed and stored separately, so an unsigned 16-bit value in the range 0 to 65535 remains. The unsigned 16-bit value then undergoes a mapping according to a table. In a specific implementation, the following table (Table 2) is used (in this implementation, the piecewise linear segment size is 128*16 in the input domain):

TABLE 2

Piecewise Linear Soft Clipping Mapping Table

| Index | Add | Mul | Input Range | Output Range |
|---|---|---|---|---|
| 0 | 0 | 16 | 128 * 000 . . . 128 * 016 − 1 | 128 * 000 . . . 128 * 016 − 1 |
| 1 | 0 | 16 | 128 * 016 . . . 128 * 032 − 1 | 128 * 016 . . . 128 * 032 − 1 |
| 2 | 0 | 16 | 128 * 032 . . . 123 * 048 − 1 | 128 * 032 . . . 123 * 048 − 1 |
| 3 | 0 | 16 | 128 * 048 . . . 123 * 064 − 1 | 128 * 048 . . . 123 * 064 − 1 |
| 4 | 0 | 16 | 128 * 064 . . . 123 * 080 − 1 | 128 * 064 . . . 123 * 080 − 1 |

TABLE 2-continued

Piecewise Linear Soft Clipping Mapping Table

| Index | Add | Mul | Input Range | Output Range |
|---|---|---|---|---|
| 5 | 0 | 16 | 128 * 080 ... 123 * 096 − 1 | 128 * 080 ... 123 * 096 − 1 |
| 6 | 0 | 16 | 128 * 096 ... 123 * 112 − 1 | 128 * 096 ... 123 * 112 − 1 |
| 7 | 0 | 16 | 128 * 112 ... 123 * 128 − 1 | 128 * 112 ... 123 * 128 − 1 |
| 8 | 8 | 15 | 128 * 128 ... 128 * 144 − 1 | 128 * 128 ... 128 * 143 − 1 |
| 9 | 17 | 14 | 128 * 144 ... 128 * 160 − 1 | 128 * 143 ... 128 * 157 − 1 |
| 10 | 27 | 13 | 128 * 160 ... 128 * 176 − 1 | 128 * 157 ... 128 * 170 − 1 |
| 11 | 38 | 12 | 128 * 176 ... 128 * 192 − 1 | 128 * 170 ... 128 * 182 − 1 |
| 12 | 50 | 11 | 128 * 192 ... 128 * 208 − 1 | 128 * 182 ... 128 * 193 − 1 |
| 13 | 63 | 10 | 128 * 208 ... 128 * 224 − 1 | 128 * 193 ... 128 * 203 − 1 |
| 14 | 77 | 9 | 128 * 224 ... 128 * 240 − 1 | 128 * 203 ... 128 * 212 − 1 |
| 15 | 92 | 8 | 128 * 240 ... 128 * 256 − 1 | 128 * 212 ... 128 * 220 − 1 |
| 16 | 108 | 7 | 128 * 256 ... 128 * 272 − 1 | 128 * 220 ... 128 * 227 − 1 |
| 17 | 125 | 6 | 128 * 272 ... 128 * 288 − 1 | 128 * 227 ... 128 * 233 − 1 |
| 18 | 143 | 5 | 128 * 288 ... 128 * 304 − 1 | 128 * 233 ... 128 * 238 − 1 |
| 19 | 162 | 4 | 128 * 304 ... 128 * 320 − 1 | 128 * 238 ... 128 * 242 − 1 |
| 20 | 182 | 3 | 128 * 320 ... 128 * 336 − 1 | 128 * 242 ... 128 * 245 − 1 |
| 21 | 203 | 2 | 128 * 336 ... 128 * 352 − 1 | 128 * 245 ... 128 * 247 − 1 |
| 22 | 225 | 1 | 128 * 352 ... 128 * 368 − 1 | 128 * 247 ... 128 * 248 − 1 |
| 23 | 225 | 1 | 128 * 368 ... 128 * 384 − 1 | 128 * 248 ... 128 * 248 − 1 |
| 24 | 225 | 1 | 128 * 384 ... 128 * 400 − 1 | 128 * 249 ... 128 * 250 − 1 |
| 25 | 225 | 1 | 128 * 400 ... 128 * 416 − 1 | 128 * 250 ... 128 * 251 − 1 |
| 26 | 225 | 1 | 128 * 416 ... 128 * 432 − 1 | 128 * 251 ... 128 * 252 − 1 |
| 27 | 225 | 1 | 128 * 432 ... 128 * 448 − 1 | 128 * 252 ... 128 * 253 − 1 |
| 28 | 225 | 1 | 128 * 448 ... 128 * 464 − 1 | 128 * 253 ... 128 * 254 − 1 |
| 29 | 225 | 1 | 128 * 464 ... 128 * 480 − 1 | 128 * 254 ... 128 * 255 − 1 |
| 30 | 225 | 1 | 128 * 480 ... 128 * 496 − 1 | 128 * 255 ... 128 * 255 − 1 |
| 31 | 225 | 0 | 128 * 496 ... 128 * 512 − 1 | 128 * 255 ... 128 * 256 − 1 |

In Table 2, the 5 high-order bits of the unsigned 16-bit value are used as the table index (0-31). The "add" and "mul" values from the table are applied to the unsigned 16-bit value as follows (the division and multiplication by constants would be typically implemented using bitshifts):

*val*=(*val*\**mul*)/16+add\*128

For example, if the unsigned 16-bit value is 128\*288+707=37571=1001001011000011b, table entry 10010b=18 is used to obtain add=143 and mul=5, so the unsigned 16-bit value becomes:

(37171\*5)/16+143\*128=30044=128\*234+92

After the mapping is performed, the sign removed earlier is added back to obtain the final output.

Because the first quarter of Table 2 (indexes 0-7) is a direct mapping and the last quarter (indexes 24-31) is a fixed-slope 16:1 mapping, those portions of the table could be implemented using separate special-case code if table lookup is more expensive than conditional execution.

Integer polynomial soft clipping, like piecewise linear soft clipping, maps all 32-bit signed integers (−2147483648 to +2147483647) to the signed 16-bit range (−32768 to +32767) in a way suitable for audio applications.

The integer polynomial soft clipping implementation described herein requires more multiplications than the piecewise linear soft clipping implementation described above but has the following advantages: no table lookups, fewer operations overall, and slightly better audio quality.

In a specific implementation (order 3), integer polynomial soft clipping is implemented with the following code:

```
INT16 clip3(INT32 i)
{
    INT32 a, b;
    #define LIM 49000
```
-continued
```
    if (i > LIM) i = LIM; else if (i < −LIM) i = −LIM;
    a = b = (i * 17) >> 5;
    a = (a * b) >> 15;
    a = (a * b) >> 15;
    return (INT16)(i − a);
}
```

Figure 16:
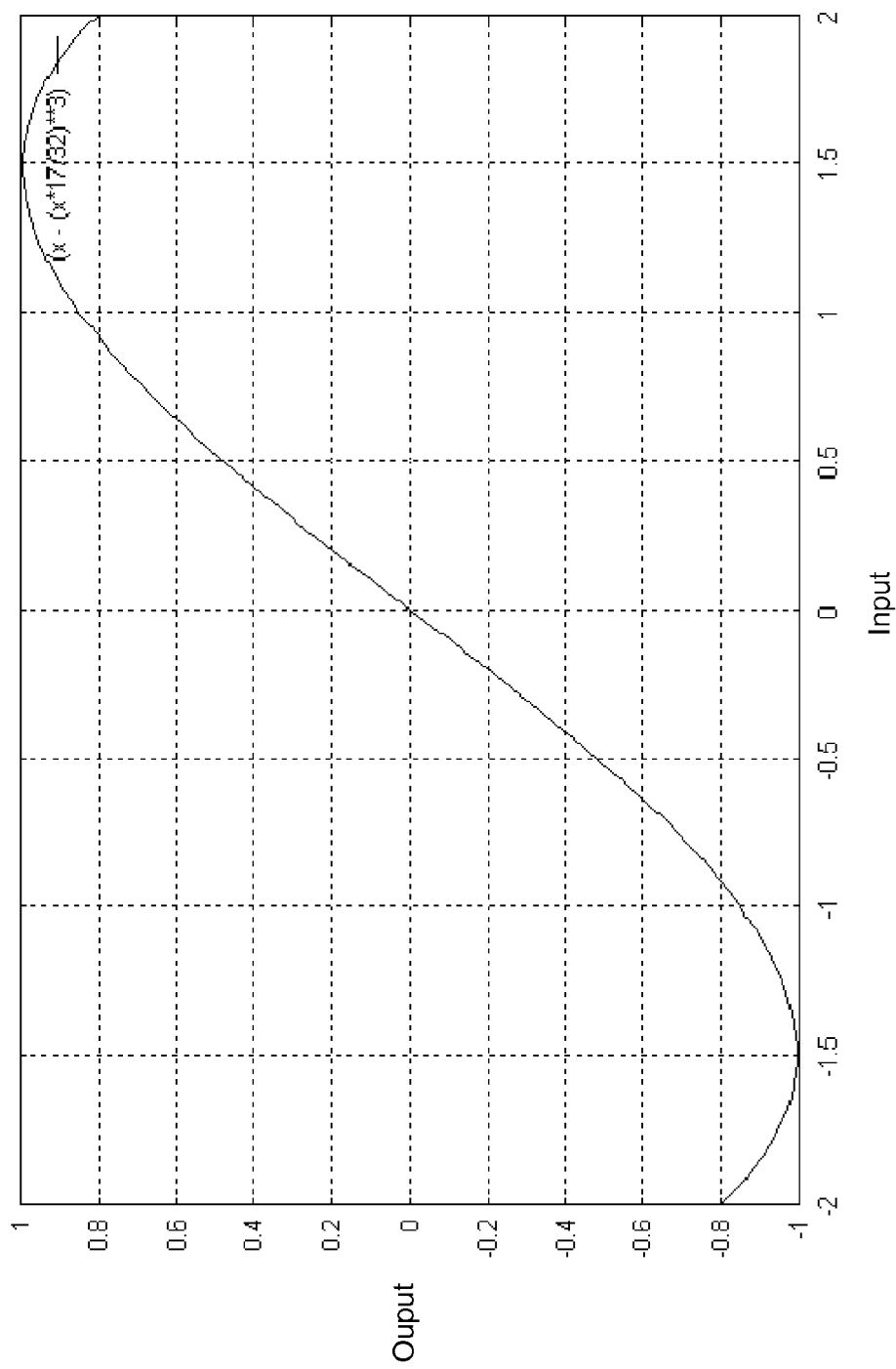
FIG. 16 depicts an example cubic curve.

Like piecewise linear soft clipping described above, integer polynomial soft clipping can be tuned for a desired gain for small signals (unity gain in this implementation). The $3^{rd}$ degree coefficient ($17/2^5$ in this implementation) is chosen so that the maximum output just reaches ~1.0 (~32768). The "LIM" value is chosen to avoid using portions of the cubic curve beyond its extrema (since it is desirable for a soft clipping function to be monotone increasing), see FIG. 16 (FIG. 16 is drawn with a scale 1.0=32768, so 1.5 corresponds to about 49000).

Higher order polynomials can be used, although $3^{rd}$ order handles larger input signals without saturation (e.g., a $5^{th}$ order version would require a LIM of about 41000 to keep the function monotone increasing). In some implementations, a power-of-two LIM value (e.g., +65535/−65536) can be used to improve the execution speed of the LIM logic (e.g., using bit operation tricks) but at the expense of allowing the clipping curve to become slightly non-monotone.

The bass boost techniques and solutions described in this application can be used in various combinations to implement a bass boost filter. For example, an integer bass boost filter can use a combination of standard coupled form implementation and modified coupled form implementation (e.g., switching between the two depending on user-settable parameters). Or, an integer bass boost filter can use a single coupled form implementation (standard or modified) with user-settable parameters. Or, an integer bass boost filter can be implemented using only modified coupled form structure implementation. Any of these bass boost filter designs can be implemented with or without adaptive output gain. Furthermore, soft clipping (e.g., piecewise linear soft clipping or integer polynomial soft clipping) can be applied to any of these bass boost filter designs.

Any of the methods described herein can be performed via one or more computer-readable media (e.g., storage or other tangible media) having computer-executable instructions for performing (e.g., causing a computing device or computer to perform) such methods. Operation can be fully automatic, semi-automatic, or involve manual intervention.

Having described and illustrated the principles of our innovations in the detailed description and accompanying drawings, it will be recognized that the various embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A method for dynamically boosting bass frequencies of audio, the method comprising:
    receiving an input audio signal;
    applying a high-pass filter to the input audio signal to produce an output of the high-pass filter;
    determining a current level by subtracting the output of the high-pass filter from the input audio signal;
    determining a target gain amount based at least in part upon a target level and the current level;
    based at least in part on the target gain amount, dynamically adjusting the output of the high-pass filter by a first gain;
    based at least in part on the target gain amount, dynamically adjusting the input audio signal by a second gain; and
    producing an output audio signal by combining the gain-adjusted input audio signal and the gain-adjusted output of the high-pass filter.

2. The method of claim 1 wherein the current level is an aggregate level generated from a plurality of input samples.

3. The method of claim 1 further comprising:
    determining a current gain amount based at least in part upon the target gain amount and a previous current gain amount;
    wherein the dynamically adjusting the output of the high-pass filter by a first gain based at least in part on the target gain amount comprises dynamically adjusting the output of the high-pass filter based on the current gain amount, and wherein the dynamically adjusting the input audio signal by a second gain based at least in part on the target gain amount comprises dynamically adjusting the input audio signal based on the current gain amount.

4. The method of claim 1 further comprising:
    applying an adaptive output gain processing to the output audio signal to prevent clipping.

5. The method of claim 1 further comprising:
    applying piecewise linear soft clipping to the output audio signal.

6. The method of claim 1 further comprising:
    applying integer polynomial soft clipping to the output audio signal.

7. The method of claim 1 wherein the high-pass filter is implemented using a coupled form structure implementation, wherein the coupled form structure implementation is a standard coupled form structure implementation, and wherein the input audio signal is delayed before adjusting the input audio signal by the second gain.

8. The method of claim 1 wherein the high-pass filter is implemented using a coupled form structure implementation, wherein the coupled form structure implementation is a modified coupled form structure implementation, and wherein an extra delay is not required before adjusting the input audio signal by the second gain.

9. The method of claim 1 wherein the determining the target gain amount comprises calculating a ratio of the target level and the current level.

10. The method of claim 1 wherein the target gain amount is determined using a lookup table.

11. The method of claim 1 performed using integer calculations.

12. The method of claim 1 wherein the method is implemented, at least in part, by an audio processing device.

13. One or more computer-readable tangible storage media storing computer-executable instructions for causing an audio processing device to perform the method of claim 1.

14. A dynamic integer bass boost filter, the filter comprising:
    a high-pass filter, wherein the high-pass filter is configured to receive an input audio signal and produce an output of the high-pass filter; and
    a dynamic boost module, wherein the dynamic boost module is configured to:
        determine a current level by subtracting the output of the high-pass filter from the input audio signal to produce a current measure of bass level and averaging the current measure of bass level with one or more prior current levels;
        determine a target gain amount based at least in part upon a target level and the current level;
        based at least in part on the target gain amount, dynamically adjust the output of the high-pass filter by a first gain; and
        based at least in part on the target gain amount, dynamically adjust the input audio signal by a second gain;
    wherein an output audio signal is produced by combining the gain-adjusted input audio signal and the gain-adjusted output of the high-pass filter.

15. The filter of claim 14 wherein the dynamic boost module is further configured to:
    determine a current gain amount based at least in part upon the target gain amount and a previous current gain amount;
    wherein the dynamically adjusting the output of the high-pass filter by a first gain based at least in part on the target gain amount comprises dynamically adjusting the output of the high-pass filter based on the current gain amount, and wherein the dynamically adjusting the input audio signal by a second gain based at least in part on the target gain amount comprises dynamically adjusting the input audio signal based on the current gain amount.

16. The filter of claim 14 wherein the determining the target gain amount comprises using a lookup table.

17. A method for dynamically boosting bass frequencies of audio, the method comprising:

receiving an input audio signal;

applying a high-pass filter to the input audio signal to produce an output of the high-pass filter;

determining a current bass level of the input audio signal by subtracting the output of the high-pass filter from the input audio signal, wherein the current bass level is an aggregate bass level generated from a plurality of input samples;

determining a target bass gain amount based at least in part upon a target bass level and the current bass level;

determining a current bass gain amount based at least in part upon the target bass gain amount and a previous current bass gain amount;

based at least in part on the current bass gain amount, dynamically adjusting the output of the high-pass filter by a first gain;

based at least in part on the current bass gain amount, dynamically adjusting the input audio signal by a second gain; and producing an output audio signal by adding the gain-adjusted input audio signal and the gain-adjusted output of the high-pass filter.

18. The method of claim 17 wherein the high-pass filter is implemented using a coupled form structure implementation.

19. The method of claim 17 performed using integer calculations.

20. One or more computer-readable tangible storage media storing computer-executable instructions for causing an audio processing device to perform the method of claim 17.

* * * * *